United States Patent
Lee et al.

(10) Patent No.: US 10,809,303 B2
(45) Date of Patent: Oct. 20, 2020

(54) DEVICE AND METHOD FOR ESTIMATING STATE OF BATTERY

(71) Applicant: LG CHEM, LTD., Seoul (KR)

(72) Inventors: Hyunchul Lee, Daejeon (KR); Jongmin Park, Daejeon (KR); Kiwook Jang, Daejeon (KR); Jongbum Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 489 days.

(21) Appl. No.: 15/541,613

(22) PCT Filed: Jan. 28, 2016

(86) PCT No.: PCT/KR2016/000961
§ 371 (c)(1),
(2) Date: Jul. 5, 2017

(87) PCT Pub. No.: WO2016/122238
PCT Pub. Date: Aug. 4, 2016

(65) Prior Publication Data
US 2018/0024199 A1    Jan. 25, 2018

(30) Foreign Application Priority Data
Jan. 28, 2015 (KR) ........................ 10-2015-0013448

(51) Int. Cl.
*G01R 31/367* (2019.01)
*G01R 31/382* (2019.01)
(Continued)

(52) U.S. Cl.
CPC ........... *G01R 31/367* (2019.01); *G01R 31/28* (2013.01); *G01R 31/2812* (2013.01);
(Continued)

(58) Field of Classification Search
CPC .... G01R 31/36; G01R 31/367; G01R 31/392; G01R 31/382; G01R 31/28; G01R 31/2812
See application file for complete search history.

(56) References Cited

U.S. PATENT DOCUMENTS 7,684,942 B2    3/2010  Yun et al.
8,965,723 B2    2/2015  Jo et al.
(Continued)

FOREIGN PATENT DOCUMENTS

EP          1 933 158 A1    6/2008
JP          2011-530696 A   12/2011
(Continued)

OTHER PUBLICATIONS

European Search Report for Appl. No. 16743716.9 dated Dec. 21, 2017.
(Continued)

*Primary Examiner* — Catherine T. Rastovski
(74) *Attorney, Agent, or Firm* — Birch, Stewart, Kolasch & Birch, LLP

(57) ABSTRACT

The present invention relates to an apparatus and a method for estimating a state of a battery, and more particularly, an apparatus for estimating a state of a battery includes: a first SOC estimating unit estimating a first state of charging (SOC) of the battery based on open circuit voltage and a temperature of the battery; a first SOH estimating unit estimating a first state of health of the battery based on the first SOC and the current of the battery; and a second SOC estimating unit estimating a second SOC of the battery based on the first SOH, charging/discharging voltage, the temperature, and the current of the battery or estimating the second SOC of the battery based on the charging/discharging voltage, the temperature, and the current of the battery.

7 Claims, 5 Drawing Sheets

(51) Int. Cl.
*G01R 31/392* (2019.01)
*G01R 31/28* (2006.01)
*G01R 31/36* (2020.01)

(52) U.S. Cl.
CPC ........... *G01R 31/36* (2013.01); *G01R 31/382* (2019.01); *G01R 31/392* (2019.01)

(56) References Cited

U.S. PATENT DOCUMENTS

| | | | |
|---|---|---|---|
| 2008/0091363 A1 | 4/2008 | Lim et al. | |
| 2008/0204031 A1* | 8/2008 | Iwane | G01R 31/389 324/430 |
| 2009/0128097 A1* | 5/2009 | Esnard | G01R 31/392 320/137 |
| 2010/0036626 A1* | 2/2010 | Kang | G01R 31/392 702/63 |
| 2013/0043876 A1 | 2/2013 | Liu et al. | |
| 2014/0074416 A1 | 3/2014 | Park et al. | |
| 2015/0369873 A1* | 12/2015 | Nakao | G01R 31/3842 702/63 |
| 2017/0005488 A1* | 1/2017 | Suzuki | B60L 58/12 |
| 2017/0010327 A1* | 1/2017 | Nishiguchi | G01R 31/392 |

FOREIGN PATENT DOCUMENTS

| | | |
|---|---|---|
| KR | 10-2008-0039655 A | 5/2008 |
| KR | 10-2013-0071957 A | 7/2013 |
| KR | 10-2013-0083220 A | 7/2013 |
| KR | 10-2013-0105123 A | 9/2013 |
| KR | 10-2014-0053592 A | 5/2014 |
| KR | 10-2014-0070790 A | 6/2014 |

OTHER PUBLICATIONS

International Search Report (PCT/ISA/210) issued in PCT/KR2016/000961, dated Mar. 23, 2016.

* cited by examiner

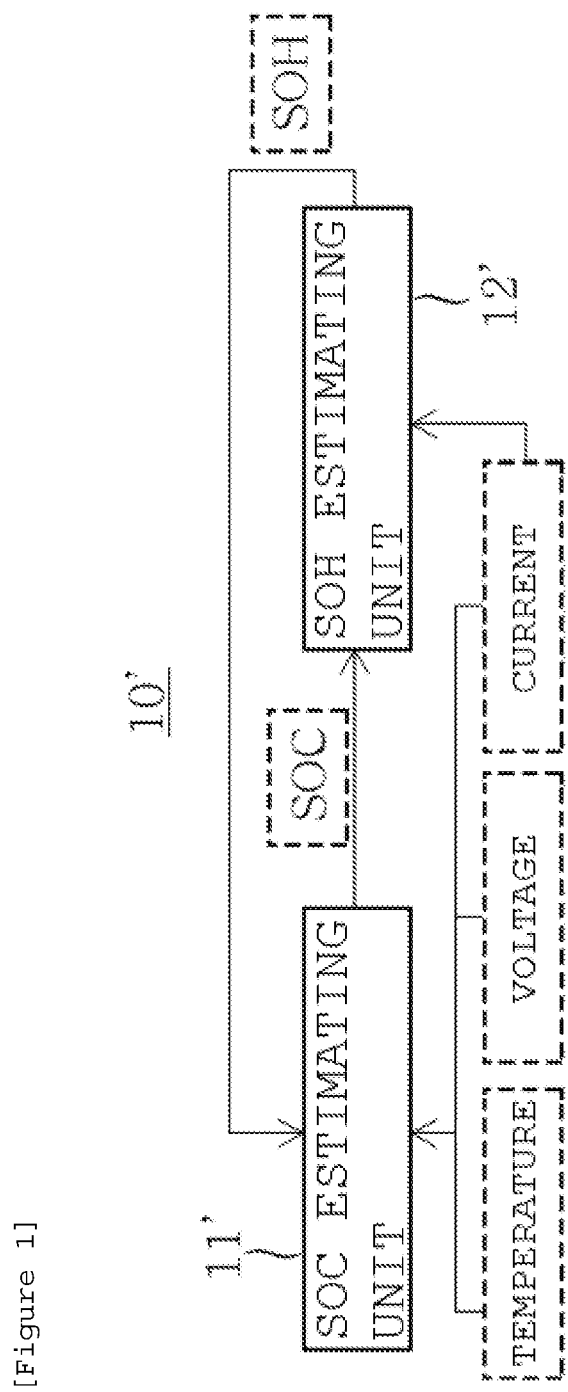
[Figure 1]

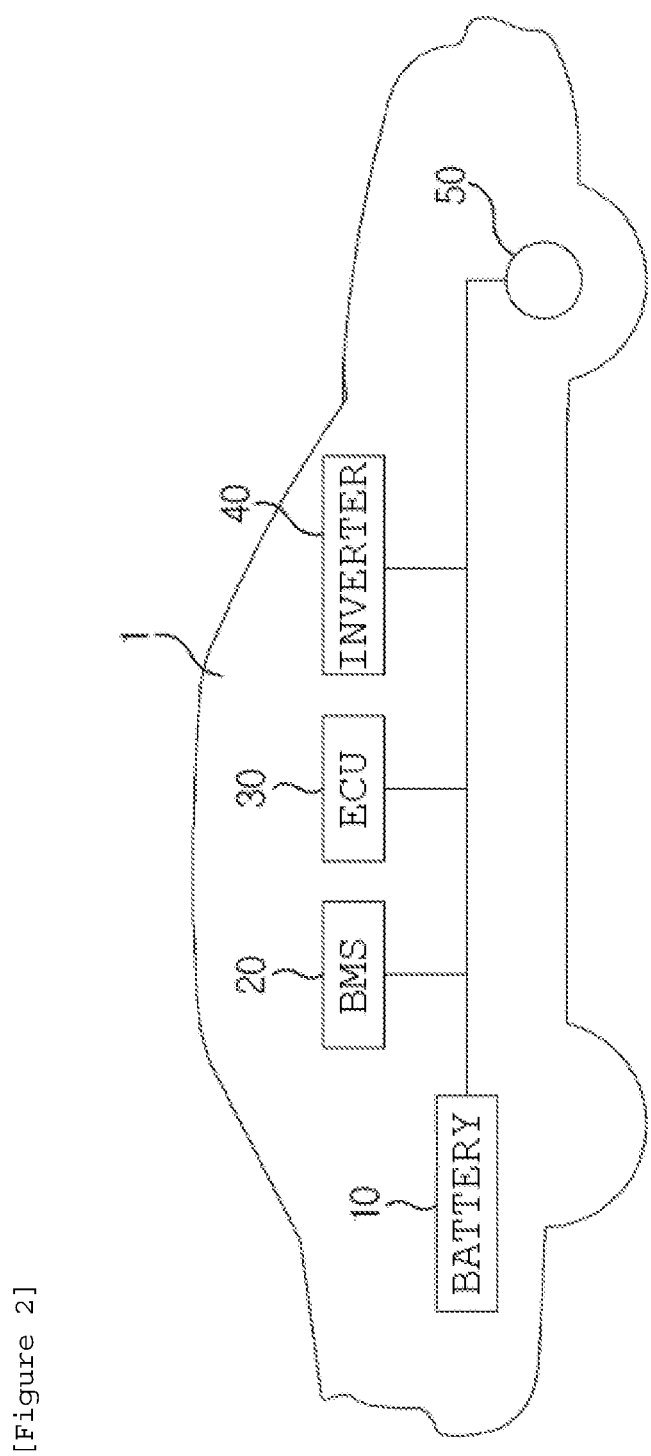
[Figure 2]

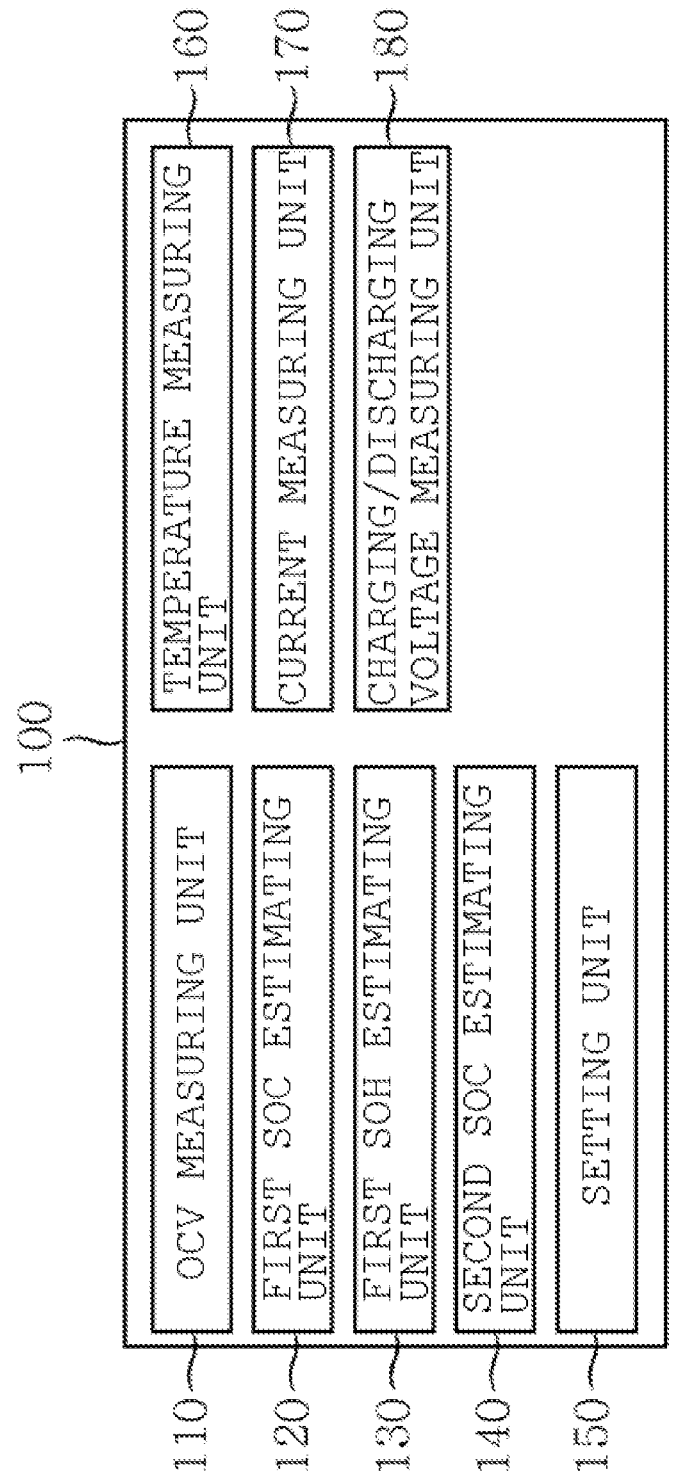
[Figure 3]

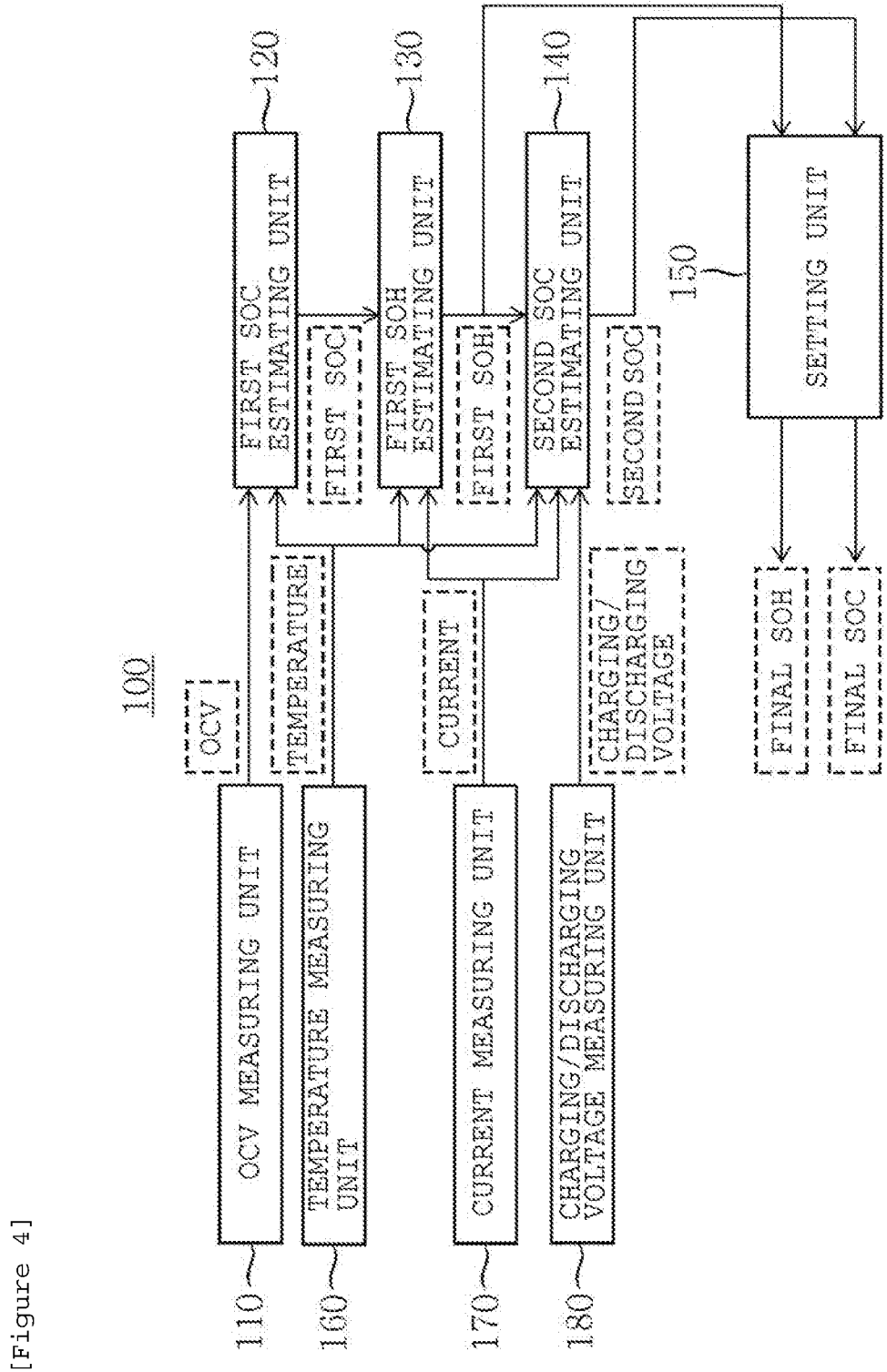
[Figure 4]

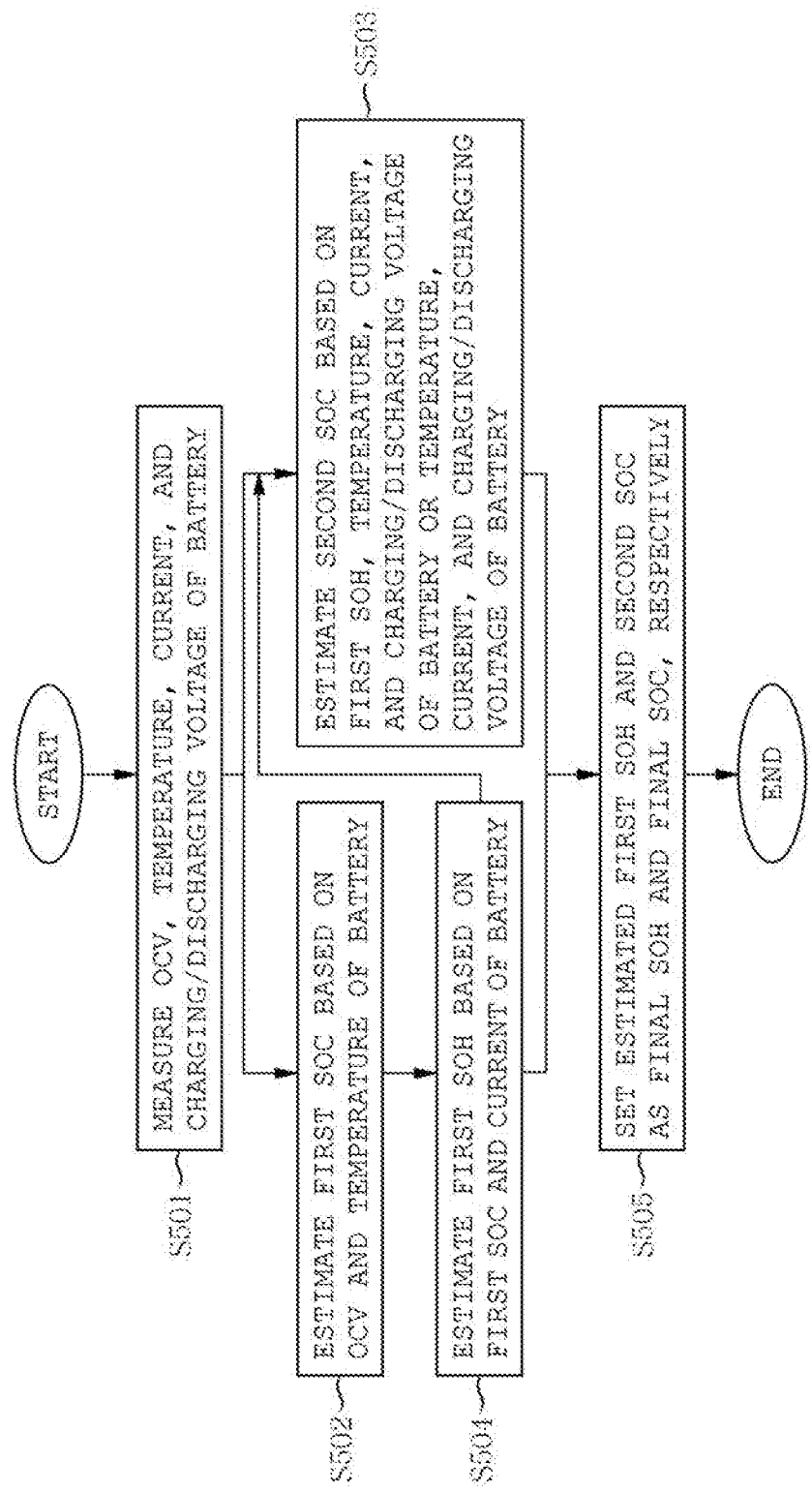
[Figure 5]

DEVICE AND METHOD FOR ESTIMATING STATE OF BATTERY

TECHNICAL FIELD

This application claims priority to and the benefit of Korean Patent Application No. 10-2015-0013448 filed in the Korean Intellectual Property Office on Jan. 28, 2015, the entire contents of which are incorporated herein by reference.

The present invention relates to an apparatus and a method for estimating a state of a battery, and more particularly, to an apparatus and a method for estimating a state of a battery, which estimate a first state of charging (SOC) of a battery based on open circuit voltage (OCV) and a temperature of the battery, estimate a first state of health (SOH) of the battery based on the estimated first SOC of the battery and the current of the battery, estimate a second SOC of the battery based on the estimated first SOH of the battery, and charging/discharging voltage, temperature, and current of the battery or estimate the second SOC of the battery based on the charging/discharging voltage, temperature, and current of the battery to estimate the second SOC from the first SOH in which even though an error occurs in a current measurement value of the battery, the occurring error is reflected only to initial estimation of the second SOC and the error is not reflected to reestimation of the second SOC after the error occurs in the current measurement value, thereby enhancing accuracies of the SOC and the SOH of the battery.

BACKGROUND ART

A battery state estimating apparatus 10' is configured to include an SOC estimating unit 11' estimating a state of charging (SOC) of a battery and an SOH estimating unit 12' estimating a state of health (SOH) of the battery.

The SOC estimating unit 11' estimates the SOC of the battery based on measurement values of current, voltage, a temperature, etc., of the battery and the SOH estimating unit 12' estimates the SOH of the battery based on the estimated SOC of the battery and the current of the battery.

Thereafter, the SOC estimating unit 11' estimates the SOC of the battery again based on the estimated SOH of the battery. Therefore, a BMS including the battery state estimating apparatus 10' prevents overcharging and overdischarging of the battery by using the SOC and the SOH of the battery and controls charging/discharging of the battery so that power efficiency is enhanced.

However, since the battery state estimating apparatus 10' in the related art reflects the SOH of the battery in the SOC estimating unit 11' and reflects the SOC of the battery in the SOH estimating unit 12' to estimate the SOC and the SOH of the battery, respectively, when errors occur in measurement values of sensors that measure voltage, current, and a temperature of the battery, the occurring errors are accumulated, and as a result, accuracies of estimation values deteriorate as the SOC and the SOH of the battery are repeatedly estimated even though only one error occurs in the sensor.

Therefore, in order to solve the problem, the present inventor has invented an apparatus and a method for estimating a state of a battery, which estimate a first state of charging (SOC) of a battery based on open circuit voltage (OCV) and a temperature of the battery, estimate a first state of health (SOH) of the battery based on the estimated first SOC of the battery and the current of the battery, estimate a second SOC of the battery based on the estimated first SOH of the battery, and charging/discharging voltage, temperature, and current of the battery or estimate the second SOC of the battery based on the charging/discharging voltage, temperature, and current of the battery to estimate the second SOC from the first SOH in which even though an error occurs in a current measurement value of the battery, the occurring error is reflected only to initial estimation of the second SOC and the error is not reflected to reestimation of the second SOC after the error occurs in the current measurement value, thereby enhancing accuracies of the SOC and the SOH of the battery.

DETAILED DESCRIPTION OF THE INVENTION

Technical Problem

An object of the present invention is to provide an apparatus and a method for estimating a state of a battery, which estimate a first state of charging (SOC) of a battery based on open circuit voltage (OCV) and a temperature of the battery, estimate a first state of health (SOH) of the battery based on the estimated first SOC of the battery and current of the battery, estimate a second SOC of the battery based on the estimated first SOH of the battery, and charging/discharging voltage, temperature, and current of the battery or estimate the second SOC of the battery based on the charging/discharging voltage, temperature, and current of the battery to estimate the second SOC from the first SOH in which even though an error occurs in a current measurement value of the battery, the occurring error is reflected only to initial estimation of the second SOC and the error is not reflected to reestimation of the second SOC after the error occurs in the current measurement value, thereby enhancing accuracies of the SOC and the SOH of the battery.

Technical Solution

An apparatus for estimating a state of a battery according to the present invention is configured to include: a first SOC estimating unit estimating a first state of charging (SOC) of the battery based on open circuit voltage (OCV) and a temperature of the battery; a first SOH estimating unit estimating a first state of health (SOH) of the battery based on the first SOC and the current of the battery; and a second SOC estimating unit estimating a second SOC of the battery based on the first SOH, the charging/discharging voltage, the temperature, and the current of the battery or estimating the second SOC of the battery based on the charging/discharging voltage, the temperature, and the current of the battery.

When the second SOC estimating unit receives the first SOH of the battery, the second SOC estimating unit may estimate the second SOC of the battery based on the first SOH, the charging/discharging voltage, the temperature, and the current of the battery.

The apparatus for estimating a state of a battery may further include an OCV measuring unit measuring the OCV of the battery after a conduction time of the battery passes a predetermined time.

The first SOH estimating unit may estimate the first SOH of the battery by using a first SOC change value of the battery and a current integration value of the battery.

The second SOC estimating unit may estimate the second SOC of the battery by using a current integration method.

The apparatus for estimating a state of a battery may further include a setting unit setting the second SOC and the first SOH of the battery as a final SOC and a final SOH of the battery, respectively.

A battery management system according to the present invention includes the apparatus for estimating a state of a battery.

A method for estimating a state of a battery according to the present invention is configured include: estimating, by a first SOC estimating unit, a first SOC of the battery based on OCV and a temperature of the battery; estimating, by a first SOH estimating unit, a first SOH of the battery based on the first SOC and the current of the battery; and estimating, by a second SOC estimating unit, a second SOC of the battery based on the first SOH, charging/discharging voltage, the temperature, and the current of the battery or estimating the second SOC of the battery based on the charging/discharging voltage, the temperature, and the current of the battery.

The estimating of the second SOC of the battery may include estimating, by the second SOC estimating unit, the second SOC of the battery based on the first SOH, the charging/discharging voltage, the temperature, and the current of the battery when the second SOC estimating unit receives the first SOH of the battery.

The method for estimating a state of a battery may further include measuring, by an OCV measuring unit, the OCV of the battery after a conduction time of the battery passes a predetermined time.

The estimating of the first SOH of the battery may include estimating, by the first SOH estimating unit, the first SOH of the battery by using a first SOC change value of the battery and a current integration value of the battery.

The estimating of the second SOC of the battery may further include estimating, by the second SOC estimating unit, the second SOC of the battery by using a current integration method.

The estimating of the first SOH of the battery may further include setting, by a setting unit, the second SOC and the first SOH of the battery as a final SOC and a final SOH of the battery, respectively.

Advantageous Effects

An apparatus and a method for estimating a state of a battery according to the present invention estimate a first state of charging (SOC) of a battery based on open circuit voltage (OCV) and a temperature of the battery, estimate a first state of health (SOH) of the battery based on the estimated first SOC of the battery and the current of the battery, estimate a second SOC of the battery based on the estimated first SOH of the battery, and charging/discharging voltage, temperature, and current of the battery or estimate the second SOC of the battery based on the charging/ discharging voltage, temperature, and current of the battery to estimate the second SOC from the first SOH in which even though an error occurs in a current measurement value of the battery, the occurring error is reflected only to initial estimation of the second SOC and the error is not reflected to reestimation of the second SOC after the error occurs in the current measurement value, thereby enhancing accuracies of the SOC and the SOH of the battery.

Further, according to the present invention, after a conduction time of the battery passes a predetermined time, the first SOC of the battery is estimated based on the measured OCV of the battery to reduce an error of the OCV due to a polarization phenomenon which may occur in initial charging/discharging of the battery is reduced, thereby enhancing the accuracies of the SOC and the SOH of the battery which are estimated based on the OCV.

BRIEF DESCRIPTION OF DRAWINGS

FIG. 1 is a diagram illustrating a configuration of a battery management system (BMS) including a battery state estimating apparatus in the related art.

FIG. 2 is a diagram schematically illustrating an electric vehicle to which an apparatus for estimating a state of a battery may be applied according to an embodiment of the present invention.

FIG. 3 is a block diagram illustrating a configuration of the apparatus for estimating a state of a battery according to the embodiment of the present invention.

FIG. 4 is a diagram illustrating one example of a detailed configuration of the apparatus for estimating a state of a battery according to the embodiment of the present invention.

FIG. 5 is a flowchart for describing a method for estimating a state of a battery according to an embodiment of the present invention.

BEST MODE

The present invention will be described below in detail with reference to the accompanying drawings. Herein, the repeated description and the detailed description of known function and configuration that may make the gist of the present invention unnecessarily ambiguous will be omitted. Embodiments of the present invention will be provided for more completely describing the present invention to those skilled in the art. Accordingly, shapes, sizes, and the like of elements in the drawings may be exaggerated for clearer explanation.

Throughout the specification, unless explicitly described to the contrary, the word "comprise" and variations such as "comprises" or "comprising", will be understood to imply the inclusion of stated elements but not the exclusion of any other elements.

In addition, the term "unit" disclosed in the specification means a unit that processes at least one function or operation and this may be implemented by hardware or software or a combination of hardware and software.

FIG. 2 is a diagram schematically illustrating an electric vehicle to which an apparatus for estimating a state of a battery may be applied according to an embodiment of the present invention.

In FIG. 2, an example in which the apparatus for estimating a state of a battery according to the embodiment of the present invention is applied to the electric vehicle is illustrated, but the apparatus for estimating a state of a battery according to the embodiment of the present invention may be applied to all technical fields to which a secondary battery may be applied, such as a mobile device, an energy storage system, or an uninterruptible power supply apparatus in addition to the electric vehicle.

Referring to FIG. 2, the electric vehicle 1 may be configured to include a battery 10, a battery management system (BMS) 20, an electronic control unit (ECU) 30, an inverter 40, and a motor 50.

The battery 10 is an electric energy source that drives the electric vehicle 1 by providing driving force to the motor 50. The battery 10 may be charged or discharged by the inverter 40 by driving the motor 50 or an internal combustion engine (not illustrated).

Herein, a type of battery 10 is not particularly limited and the battery may be constituted by, for example, a lithium ion battery, a lithium polymer battery, a nickel cadmium battery, a nickel hydrogen battery, a nickel zinc battery, and the like.

The BMS 20 estimates the state of the battery 10 and manages the battery 10 by using estimated state information. For example, the battery 10 estimates and manages the state information of the battery 10, which includes a maximum input/output power allowance amount, output voltage, and the like of the battery 10.

Further, the BMS 20 includes an apparatus 100 (FIGS. 3 and 4) for estimating a state of a battery to be described below to estimate a state of charging (SOC) and a state of health (SOH) of the battery 10 in addition to the aforementioned state information.

In addition, the BMS 20 may control charging or discharging of the battery 10 by using the state information and furthermore, also estimate a replacement time of the battery 10.

The ECU 30 is an electronic control device that controls the state of the electric vehicle 1. For example, the ECU 30 determines a torque degree based on information such as an accelerator, a brake, a speed, and the like and controls an output of the motor 50 according to the torque information.

Further, the ECU 30 transmits a control signal to the inverter 40 so that the battery 10 is charged or discharged based on the state information such as the SOC, the SOH, etc., of the battery 10, which are transferred by the BMS 20.

The inverter 40 allows the battery 10 to be charged or discharged based on the control signal of the ECU 30.

The motor 50 drive the electric vehicle 1 based on control information (e.g., torque information) transferred from the ECU 30 by using electric energy of the battery 10.

FIG. 3 is a block diagram illustrating a configuration of the apparatus for estimating a state of a battery according to the embodiment of the present invention and FIG. 4 is a diagram illustrating one example of a detailed configuration of the apparatus for estimating a state of a battery according to the embodiment of the present invention.

Referring to FIGS. 3 and 4, the apparatus 100 for estimating a state of a battery may be configured to include an open circuit voltage (OCV) measuring unit 110, a first state of charging (SOC) estimating unit 120, a first state of health (SOH) estimating unit 130, a second SOC estimating unit 140, and a setting unit 150. Besides, the apparatus 100 for estimating a state of a battery may be configured to further include a temperature measuring unit 160, a current measuring unit 170, and a charging/discharging voltage measuring unit 180.

The apparatus 100 for estimating a state of a battery illustrated in FIGS. 3 and 4 follows the embodiment and constituent elements thereof are not limited to the embodiment illustrated in FIGS. 3 and 4 and as necessary, the constituent elements may be added, modified, or deleted.

The OCV measuring unit 110 may serve to measure voltage applied to both ends of a battery which is in a no-load state. In this case, the OCV measuring unit 110 may measure OCV of the battery in which a conduction time of the battery is over a predetermined time.

Herein, the predetermined time may be a time when reduction of electromotive power of the battery due to a polarization phenomenon which occurs in initial charging/discharging of the battery is restored. For example, the predetermined time may be 15 minutes. Therefore, the OCV measuring unit 110 measures the OCV of the battery by avoiding the polarization phenomenon of the battery to enhance accuracies of the SOC and the SOH of the battery, which are estimated based on the OCV of the battery.

The first SOC estimating unit 120 may serve to estimate the first SOC of the battery based on the OCV and a temperature of the battery. In this case, if an SOC estimating method of the first SOC estimating unit 120 estimates the SOC of the battery based on the OCV of the battery, it is noted that a type of the SOC estimating method is not particularly limited.

Herein, the first SOC of the battery, which is estimated from the first SOC estimating unit 120 may not be the state information of the battery, which is provided to the BMS and used for managing and controlling the battery but the state information of the battery, which is estimated for estimating the SOH of the battery.

Further, the temperature of the battery may be measured from the temperature measuring unit 160 and it is noted that the type of temperature measuring unit 160 is not particularly limited if the temperature measuring unit 160 measures the temperature of the battery.

The first SOH estimating unit 130 may serve to estimate the first SOH of the battery based on the first SOC and current of the battery. In more detail, the first SOH estimating unit 130 may estimate the first SOH of the battery by using a first SOC change value of the battery and a current integration value of the battery.

Herein, the current of the battery may be measured by the current measuring unit 170 and the current measuring unit 170 may use a current sensor corresponding to at least one among a current transformer type, a hall element type, and a fuse type in order to measure the current of the battery and include one or more switch elements, capacitors, lead wires, and the like and further include a stabilizer (e.g., a resistor having a high resistance value, etc.) (not illustrated) for protecting an inner part from high current.

That is, since the first SOH estimating unit 130 estimates the first SOH of the battery again by receiving the first SOC and the temperature of the battery whenever estimating the first SOH, an error occurs only in only the first SOH estimated based on a measurement value in which the error occurs even though a measurement error occurs in the OCV and the temperature of the battery and the current of the battery which is a basis of the estimation of the first SOC and thereafter, the first SOH may also be accurately estimated when the OCV, the temperature, and the current of the battery are accurately measured.

The second SOC estimating unit 140 may serve to estimate the second SOC of the battery based on the first SOH, the charging/discharging voltage, the temperature, and the current of the battery or estimate the second SOC of the battery based on the charging/discharging voltage, the temperature, and the current of the battery.

In more detail, when the second SOC estimating unit 140 receives the first SOH of the battery from the first SOH estimating unit 130, the second SOC estimating unit 140 estimates the second SOC of the battery based on the first SOH and the charging/discharging voltage, the temperature, and the current of the battery and when there is no first SOH of the battery, which is received from the first SOH estimating unit 130, the second SOC estimating unit 140 may estimate the second SOC of the battery based on the charging/discharging voltage, the temperature, and the current of the battery except for the first SOH.

In this case, it is noted that the type of SOC estimating method of the second SOC estimating unit 140 is not particularly limited.

Herein, the charging/discharging voltage of the battery may be voltage of the battery measured when the voltage is applied to the battery to perform charging or a load is connected to the battery and power is supplied to the load to discharge the battery and may be measured from the charging/discharging voltage measuring unit 180.

Therefore, similarly to the first SOH estimating unit 130, in the second SOC estimating unit 140, even though the measurement error occurs in the charging/discharging voltage, the temperature, and the current of the battery which form a basis of the estimation of the second SOC, the error occurs only in the second SOC estimated based on the measurement value in which the error occurs and thereafter, when the accurate measurement value is measured, the second SOC may also be accurately estimated.

The setting unit 150 may serve to finally set the first SOH estimated by the first SOH estimating unit 130 as a final SOH of the battery and set the second SOC estimated by the second SOC estimating unit 140 as the final SOC of the battery.

In this case, the battery management system according to the present invention efficiently controls the charging/discharging of the battery by receiving the final SOC and the final SOH of the battery to maintain the battery in an appropriate operating state and performance and prevent overcharging and overdischarging of the battery, thereby extending a life-span of the battery.

FIG. 5 is a flowchart for describing a method for estimating a state of a battery according to an embodiment of the present invention.

Referring to FIG. 5, an OCV measuring unit, a temperature measuring unit, a current measuring unit, and a charging/discharging voltage measuring unit measure OCV, a temperature, current, and charging/discharging voltage of the battery, respectively (S501).

A first SOC estimating unit estimates a first SOC based on the measured OCV and temperature of the battery (S502) and when there is no first SOH estimated simultaneously, a second SOC estimating unit estimates a second SOC based on the measured temperature, current, and charging/discharging voltage of the battery (S503).

Subsequently to step S502, the first SOH estimating unit estimates the first SOH based on the estimated first SOC and the measured current of the battery (S504) and the estimated first SOH is transferred to the second SOC estimating unit, and as a result, the second SOC estimating unit estimates the second SOC based on the estimated first SOH and the measured temperature, current, and charging and discharging voltage of the battery (S503).

Subsequently, a setting unit sets the first SOH and the second SOC of the battery, which are estimated in steps S504 and S503 as a final SOH and a final SOC, respectively (S503).

Therefore, in the method for estimating a state of a battery according to the embodiment of the present invention, when a measurement error occurs in a measurement value of the battery which forms a basis for estimating the SOH and the SOC of the battery, the errors occur only in the SOH and SOC of the battery estimated based on the measurement value in which the error occurs and the errors may not be accumulated in the subsequently estimated SOH and SOC of the battery.

Meanwhile, the method for estimating a state of a battery according to the embodiment of the present invention is implemented in a form of a program command which may be performed through various computer means and may be recorded in the computer readable medium. The computer readable medium may include one or a combination of a program command, a data file, and a data structure. The program command recorded in the medium may be specially designed and configured for the present invention, or may be publicly known to and used by those skilled in the computer software field.

An example of the computer readable recording medium may include a magnetic media, such as a hard disk, a floppy disk, and a magnetic tape, optical medium such as a CD-ROM and a DVD, magneto-optical recording media such as a floptical disk, and all types of hardware devices such as a ROM, a RAM, and a flash memory, which are specially configured to store and execute the program command. An example of the program command includes a high-level language code executable by a computer by using an interpreter and the like, as well as a machine language code created by a compiler. The hardware devices may be configured to operate as one or more software modules in order to perform the operation of the present invention, and an opposite situation thereof is available.

The instructions of principles of the present invention may be implemented as a combination of hardware and software. Further, the software may be implemented as application programs which are actually implemented on a program storage unit. The application programs may be uploaded on a machine including any suitable architecture and executed by the machine. Preferably, the machine may be implemented on a computer platform having hardware such as one or more central processing units (CPUs), a computer processor, a random access memory (RAM), and I/O interfaces. Further, the computer platform may include an operating system and a microinstruction code. Various processes and functions described herein may be some of the microinstruction codes, some of application programs, or any combination thereof and executed by various processing devices including the CPU. Additionally, various other peripheral devices such as an additional data storage unit and a printer may be connected to the computer platform.

The present invention disclosure has been described with reference to the preferred embodiments. However, it will be appreciated by those skilled in the art that various modifications and changes of the present disclosure can be made without departing from the spirit and the scope of the present invention which are defined in the appended claims and their equivalents.

The invention claimed is:

1. An apparatus for estimating a state of a battery, the apparatus comprising:
   a first SOC estimating unit estimating a first state of charging (SOC) of the battery based on open circuit voltage (OCV) and a temperature of the battery;
   a first SOH estimating unit estimating a first state of health (SOH) of the battery based on the estimated first SOC of the battery and a current integration value of the battery; and
   a second SOC estimating unit configured to:
      when the second SOC estimating unit receives the estimated first SOH within a first time period, estimate a second SOC of the battery based on the first SOH, charging/discharging voltage, the temperature, and the current of the battery, and
      when the second SOC estimating unit does not receive the estimated first SOH within the first time period, estimate the second SOC of the battery based on the charging/discharging voltage, the temperature, and the current of the battery,
   wherein the OCV is measured via an OCV measuring unit that measures voltage of the battery when the battery is in a no-load state and after a predetermined second time period to avoid a polarization phenomenon which occurs in initial charging/discharging of the battery.

2. The apparatus for estimating a state of a battery of claim 1, wherein the second SOC estimating unit estimates the second SOC of the battery by using a current integration method.

3. The apparatus for estimating a state of a battery of claim 1, further comprising:
   a setting unit setting the second SOC and the first SOH of the battery as a final SOC and a final SOH of the battery, respectively.

4. A battery management system comprising:
   the apparatus for estimating a state of a battery of claim 1.

5. A method for estimating a state of a battery, the method comprising:
   estimating, by a first SOC estimating unit, a first SOC of the battery based on OCV and a temperature of the battery;
   estimating, by a first SOH estimating unit, a first SOH of the battery based on the estimated first SOC of the battery and a current integration value of the battery;
   when a second SOC estimating unit receives the estimated first SOH within a first time period, estimating, by the second SOC estimating unit, a second SOC of the battery based on the first SOH, charging/discharging voltage, the temperature, and the current of the battery; and
   when the second SOC estimating unit does not receive the estimated first SOH within the first time period, estimating the second SOC of the battery based on the charging/discharging voltage, the temperature, and the current of the battery,
   wherein the OCV is measured via an OCV measuring unit that measures voltage of the battery when the battery is in a no-load state and after a predetermined second time period to avoid a polarization phenomenon which occurs in initial charging/discharging of the battery.

6. The method for estimating a state of a battery of claim 5, wherein the estimating of the second SOC of the battery further includes estimating, by the second SOC estimating unit, the second SOC of the battery by using a current integration method.

7. The method for estimating a state of a battery of claim 5, further comprising:
   setting, by a setting unit, the second SOC and the first SOH of the battery as a final SOC and a final SOH of the battery, respectively.

* * * * *